United States Patent
Jang et al.

(10) Patent No.: US 9,540,564 B2
(45) Date of Patent: Jan. 10, 2017

(54) QUANTUM ROD AND METHOD OF FABRICATING THE SAME

(71) Applicant: LG DISPLAY CO., LTD., Seoul (KR)

(72) Inventors: Kyung-Kook Jang, Paju-si (KR);
Jin-Wuk Kim, Goyang-si (KR);
Byung-Geol Kim, Paju-si (KR);
Kyu-Nam Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 239 days.

(21) Appl. No.: 14/104,142

(22) Filed: Dec. 12, 2013

(65) Prior Publication Data

US 2014/0319453 A1    Oct. 30, 2014

(30) Foreign Application Priority Data

Apr. 30, 2013  (KR) ........................ 10-2013-0048678

(51) Int. Cl.
| | |
|---|---|
| *H01L 29/06* | (2006.01) |
| *H01L 31/00* | (2006.01) |
| *C09K 11/88* | (2006.01) |
| *C09K 11/02* | (2006.01) |
| *H01L 51/00* | (2006.01) |
| *H01L 21/02* | (2006.01) |

(52) U.S. Cl.
CPC ............ *C09K 11/883* (2013.01); *C09K 11/025* (2013.01); *H01L 21/02601* (2013.01); *H01L 29/0673* (2013.01); *H01L 51/0059* (2013.01); *H01L 2251/5369* (2013.01)

(58) Field of Classification Search
CPC ................. H01L 21/02601; H01L 2251/5369; H01L 29/0673; H01L 51/0059
See application file for complete search history.

(56) References Cited

U.S. PATENT DOCUMENTS

2008/0252209 A1* 10/2008 Jang ...................... C30B 7/14
                                                             313/506
2011/0306079 A1* 12/2011 Tulsky .................... B01J 13/14
                                                             435/29

FOREIGN PATENT DOCUMENTS

| CN | 101181978 A | 5/2008 |
|---|---|---|
| CN | 101690401 A | 3/2010 |
| CN | 101935875 A | 1/2011 |
| WO | WO 2012/035535 A1 | 3/2012 |

OTHER PUBLICATIONS

Office Action dated May 4, 2016 for Chinese Application No. 201310699948.6, 13 pages.

* cited by examiner

*Primary Examiner* — Zandra Smith
*Assistant Examiner* — John M Parker
(74) *Attorney, Agent, or Firm* — Brinks Gilson & Lione

(57) ABSTRACT

The present invention provides a quantum rod including a core including zinc compound; and a shell covering the core and including ZnS. The quantum rod emits the short wavelength light.

24 Claims, 5 Drawing Sheets

QUANTUM ROD AND METHOD OF FABRICATING THE SAME

CROSS-REFERENCE TO RELATED APPLICATION

This application claims priority to and the benefit of Korean Patent Application No. 10-2013-0048678 filed in Korea on Apr. 30, 2013, which is hereby incorporated by reference.

BACKGROUND

Field of the Disclosure

Embodiments of the disclosure relate to a quantum rod, and more particularly, to a quantum rod being capable of emitting short wavelength light and a method of fabricating the same.

Discussion of the Related Art

Recently, as the society has entered in earnest upon an information age, a field of display devices that represent all sorts of electrical signals as visual images has developed rapidly. Flat panel display device, such as a liquid crystal display (LCD) device, a plasma display panel (PDP) device, a field emission display (FED) device and an organic light emitting diode (OLED) device, has been introduced.

On the other hand, use of a quantum rod to the display device is researched or studied. Since the quantum rod has high emitting efficiency and excellent reproducibility, the quantum rod can be applied to various uses. For example, applications of the quantum rod to an emitting diode for lightings and a light source or other element for the LCD device are researched.

The quantum rod includes a nano-sized core particle of II-VI, III-V, I-III-VI or IV-VI semiconductor particle and a shell covering the core particle. In addition, the quantum rod further includes ligands for dispersion.

Since extinction coefficient and quantum yield of the quantum rod is very large in comparison to general dye, the quantum rod emits strong fluorescent light. In addition, by controlling a diameter of the quantum rod, a wavelength of light emitted from the quantum rod can be controlled.

The quantum rod emits linearly-polarized light. In addition, the quantum rod has an optical property is capable of controlling emission by outer electric field is applied. This may be referred to as stark effect. Accordingly, the optical efficiency of the display device can be improved by the optical property of the quantum rod.

On the other hand, to use the quantum rod for the display device, quantum rods for emitting red, green and blue lights. However, the quantum rod being capable of emitting the red light is only developed.

The quantum rod including CdSe core and CdS shell emits the red light. This quantum rod may be referred to as a CdSe/CdS quantum rod. Referring to FIG. 1, which illustrates an emission principle of the CdSe/CdS quantum rod, the CdSe/CdS quantum rod has the energy gap (Eg) of about 1.6 eV. As a result, the CdSe/CdS quantum rod emits the red light in about 775 nm wavelength.

As mentioned above, the wavelength of the emitted light from the quantum rod can be controlled by a size of the core (i.e., the diameter of the core). However, even though the size (diameter) of the core is minified to be 3~7 nm, the wavelength of the emitted light from the quantum rod can be extended within a range of 500~650 nm.

Accordingly, it is impossible to provide short wavelength light by the related art quantum rod.

SUMMARY

A quantum rod includes a core including zinc compound; and a shell covering the core and including ZnS.

According to an embodiment, a method of fabricating a quantum rod including dissolving zinc nitrate of a first weight, zinc sulfate of a second weight, a sulfur powder and a core including zinc compound in an organic solvent to form a mixture; and reacting the mixture with aliphatic amine in an reactor is provided.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings.

A quantum rod of the present invention includes a core of a zinc compound and a shell of zinc sulfide (ZnS). The shell covers the core.

Figure 1:
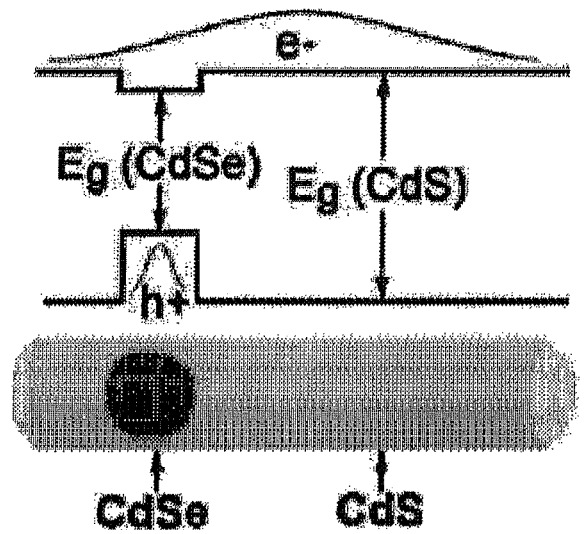
FIG. 1 illustrates an emission principle of the CdSe/CdS quantum rod.
Figure 2:
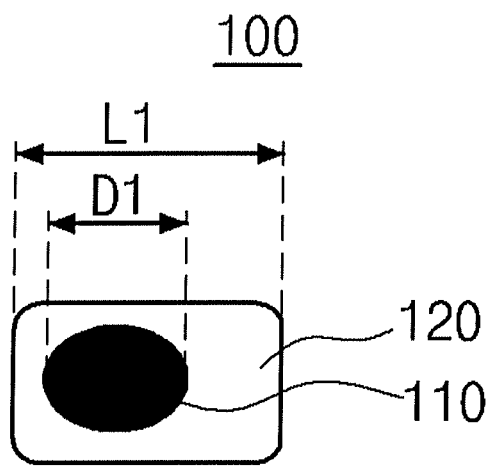
FIG. 2 is a schematic cross-sectional view of a quantum rod according to a first embodiment of the present invention.

Namely, referring to FIG. 2, which is a schematic cross-sectional view of a quantum rod according to a first embodiment of the present invention, the quantum rod 100 according to the first embodiment of the present invention includes the core 110 and the shell 120. The core 110 includes the zinc compound and has a single layered structure or a multi-layered structure. For example, the core 110 may have the single-layered structure of zinc selenide (ZnSe) or zinc selenide sulfide (ZnSeS). Alternatively, the core 110 may have the multi-layered structure including a first core of ZnSe and a second core ZnSeS. In this instance, one of the first core and the second core covers the other one of the first core and the second core.

The core 110 of ZnSe and/or ZnSeS has the Eg of about 3 eV being larger than that of the related art CdSe core such that the quantum rod 100 of the present invention emits short wavelength light. The light emitted from the quantum rod 100 of the present invention has a range of about 400 to 520 nm.

The wavelength of the emitted light from the quantum rod 100 is controlled by a size, i.e. a diameter "D1", of the core 110. In more detail, since the wavelength is proportional to the diameter "D1", shorter wavelength light can be emitted from the quantum rod including smaller core.

For example, the diameter "D1" of the core 110 has a range of about 1 to 100 nm, and beneficially about 3 to 10 nm. The core 110 has the above diameter "D1" and includes at least one of ZnSe or ZnSeS. As a result, the quantum rod 100 including the core 110 emits the short wavelength light.

The quantum rod 100 is dispersed in organic ligand solvent serving as a stabilizer. In this instance, the organic ligand is one of hydrophobic organic ligand, hydrophilic organic ligand and silicon-based organic ligand. For example, the organic ligand may include at least one of oleylamine and oleic acid.

The quantum rod, which includes the core of ZnSe and/or ZnSeS and the shell of ZnS, of the present invention is fabricated by dissolving ZnS and/or ZnSeS cores with zinc sulfate and sulfur (S) powder into solvent and reaction between the solution and aliphatic amine. Hereinafter, a synthesis of the quantum rod is explained.

Synthesis 1

Zinc sulfate (150 mg), sulfur powder (44 mg), ZnSe core (10 mg) were dissolved in toluene (1 ml). Next, the solution was dried under the temperature of about 120° C. and for about 1 hour and was stirred under a $N_2$ condition and the temperature of about 120° C. and for about 3 hours. Next, the mixture was put into a hydrothermal reactor, where oleylamine (17 ml) was stored and was reacted under the temperature of about 200° C. and for about 24 hours. Next, by precipitating (using hexane and methanol) and purifying the solution, the quantum rod was synthesized.

In the synthesis 1, the quantum rod including ZnSe core is synthesized. Alternatively, when ZnSeS core or ZnSe/ZnSeS multi-layered (or double-layered) core is used instead of the ZnSe core, the quantum rod including ZnSeS core or ZnSe/ZnSeS multi-layered core is synthesized.

Since the materials for synthesizing the quantum rod may be damaged by moisture or oxygen, the drying process is performed to remove the moisture and/or oxygen. However, the drying process may be omitted. In addition, the stirring process is performed to an active reaction. However, he stirring process is also omitted.

The hydrothermal reactor provides a closed reaction space. Oleylamine has a boiling point lower than the reaction temperature and induces a length direction growth of the ZnS shell. Other amine solvent, which has the boiling point lower than the reaction temperature and dissolves the mixture, can be used instead of and with oleylamine. Aliphatic amine having 18 or fewer carbon atoms (less C18) can be used. For example, allylamine having at least one double-bonding structure and less C18 may be used.

Figure 3:
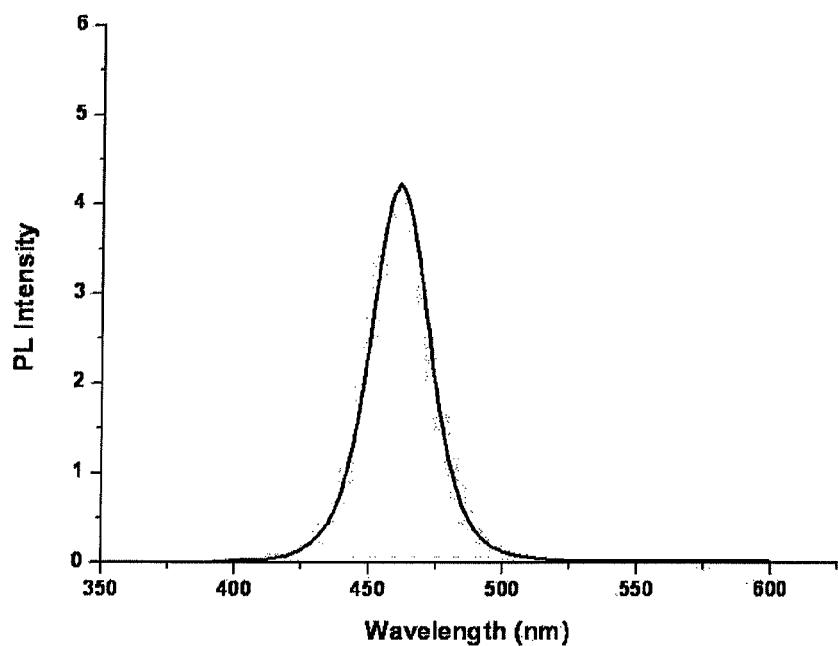
FIG. 3 is a PL spectrum of a quantum rod according to a first embodiment of the present invention.

FIG. 3 is a PL spectrum of a quantum rod according to a first embodiment of the present invention. As shown in FIG. 3, the quantum rod 100 according to the first embodiment of the present invention has a PL peak of about 447 nm. As a result, the quantum rod 100 emits the short wavelength light and has the quantum efficiency of about 6%.

As mentioned above, the wavelength emitted from the quantum rod 100 is controlled by the size or diameter of the core 110. In addition, the linearly-polarizing property of the light from the quantum rod 100 and the driving characteristic by an outer electric field are controlled by a length "L1" of the shell 120.

For example, as an aspect ratio (AR), which is a ratio of the length "L1" of the shell to the diameter (or size) "D1" of the core is large, the linearly-polarizing property of the light from the quantum rod 100 is improved. In addition, to be efficiently driven by the electric field, the quantum rod 100 is required to have the AR being equal to or larger than 2.

Figure 4:
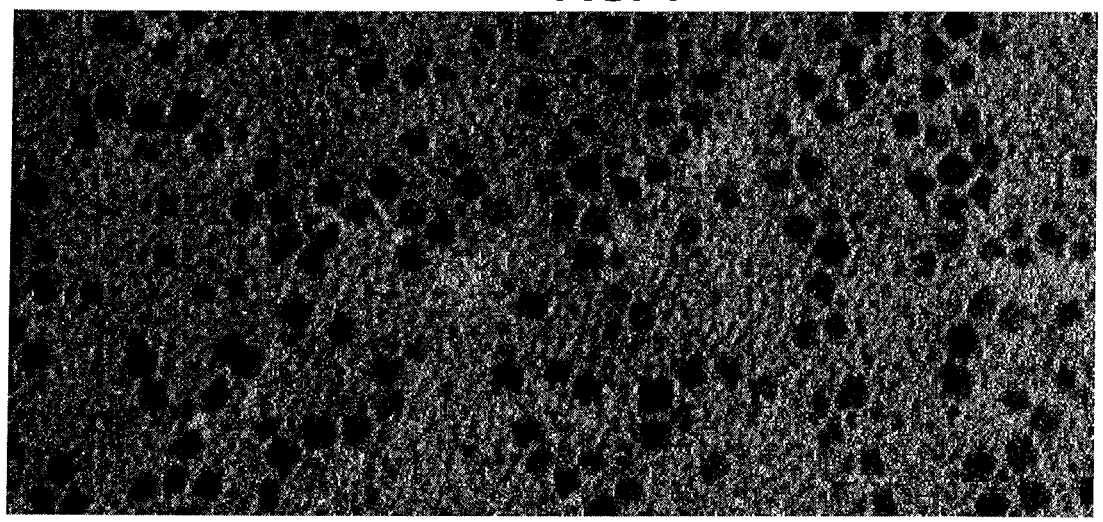
FIG. 4 is a TEM image of a quantum rod according to a first embodiment of the present invention.

However, the quantum rod according to the first embodiment of the present invention, which is synthesized by synthesis 1, has the AR less than about 1.5. Referring to FIG. 4, which is a TEM image of a quantum rod according to a first embodiment of the present invention, the diameter "D1" of the core 110 is 7.52 nm, and the length "L1" of the shell 120 is 9.40 nm. (AR=9.40/7.52=1.25)

As a result, the light from the quantum rod according to the first embodiment of the present invention has poor linearly-polarizing property, and the driving characteristic of the quantum rod by the electric field is not sufficient.

In other words, the quantum rod 100 can emits the short wavelength light, while the light from the quantum rod 100 has poor quality. In addition, ON and OFF drive of the quantum rod by the electric field is difficult.

Hereinafter, a quantum rod being capable of overcoming the above problems is introduced.

Figure 5:
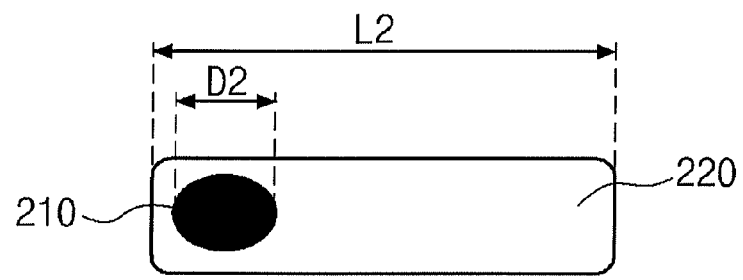
FIG. 5 is a schematic cross-sectional view of a quantum rod according to a second embodiment of the present invention.

FIG. 5 is a schematic cross-sectional view of a quantum rod according to a second embodiment of the present invention. As shown in FIG. 5, the quantum rod 200 according to a second embodiment of the present invention includes a core 210 and a shell 220. The core 110 includes a zinc compound and has a single-layered structure or multi-layered structure. For example, the core 210 may have the single-layered structure of ZnSe or ZnSeS. Alternatively, the core 110 may have the multi-layered structure including a first core of ZnSe and a second core ZnSeS. In this instance, one of the first core and the second core covers the other one of the first core and the second core. The shell 220 includes ZnS and covers the core 210.

As mentioned above, the core 210 of ZnSe and/or ZnSeS has the Eg of about 3 eV being larger than that of the related art CdSe core such that the quantum rod 200 of the present invention emits short wavelength light. The light emitted from the quantum rod 200 of the present invention has a range of about 400 to 520 nm.

The wavelength of the emitted light from the quantum rod 200 is controlled by a size, i.e. a diameter "D2", of the core 210. In more detail, since the wavelength is proportional to the diameter "D2", shorter wavelength light can be emitted from the quantum rod including smaller core.

For example, the diameter "D2" of the core 210 has a range of about 1 to 100 nm, and beneficially about 3 to 10 nm. The core 210 has the above diameter "D2" and includes at least one of ZnSe or ZnSeS. As a result, the quantum rod 200 including the core 210 emits the short wavelength light.

In addition, the linearly-polarizing property of the light from the quantum rod 200 and the driving characteristic by an outer electric field are controlled by a length of the shell 220. Namely, when the aspect ratio (AR) of the quantum rod 200 is equal to or larger than 2 (AR≥2), the light emitted from the quantum rod 200 is linearly polarized along the length of the shell 220 and a layer formed of the quantum rod 200 is efficiently driven by the electric field. For example, the shell 220 has the length "L2" of about 5 to 1000 nm, and the AR of the quantum rod 200 is about 2 to 10.

The quantum rod 200 is dispersed in organic ligand solvent serving as a stabilizer. In this instance, the organic ligand is one of hydrophobic organic ligand, hydrophilic organic ligand and silicon-based organic ligand. For example, the organic ligand may include at least one of oleylamine and oleic acid.

The quantum rod, which includes the core of ZnSe and/or ZnSeS and the shell of ZnS and has the AR larger than 2, of the present invention is fabricated by dissolving ZnS and/or ZnSeS cores with zinc sulfate, zinc nitrate and sulfur (S) powder into solvent and reaction between the solution and aliphatic amine. Hereinafter, a synthesis of the quantum rod is explained.

Synthesis 2

Zinc nitrate (128 mg), zinc sulfate (300 mg), sulfur powder (44 mg), ZnSe core (10 mg) were dissolved in toluene (1 ml). Next, the solution was dried under the temperature of about 120° C. and for about 1 hour and was stirred under a $N_2$ condition and the temperature of about 120° C. and for about 3 hours. Next, the mixture was put into a hydrothermal reactor, where oleylamine (17 ml) was stored and was reacted under the temperature of about 230° C. and for about 24 hours. Next, by precipitating (using hexane and methanol) and purifying the solution, the quantum rod was synthesized.

Synthesis 3

Zinc nitrate (256 mg), zinc sulfate (150 mg), sulfur powder (44 mg), ZnSe core (10 mg) were dissolved in toluene (1 ml). Next, the solution was dried under the temperature of about 120° C. and for about 1 hour and was stirred under a $N_2$ condition and the temperature of about 120° C. and for about 3 hours. Next, the mixture was put into a hydrothermal reactor, where oleylamine (17 ml) was stored and was reacted under the temperature of about 230° C. and for about 24 hours. Next, by precipitating (using hexane and methanol) and purifying the solution, the quantum rod was synthesized.

Synthesis 4

Zinc nitrate (128 mg), zinc sulfate (150 mg), sulfur powder (44 mg), ZnSe core (10 mg) were dissolved in toluene (1 ml). Next, the solution was dried under the temperature of about 120° C. and for about 1 hour and was stirred under a $N_2$ condition and the temperature of about 120° C. and for about 3 hours. Next, the mixture was put into a hydrothermal reactor, where oleylamine (17 ml) was stored and was reacted under the temperature of about 230° C. and for about 24 hours. Next, by precipitating (using hexane and methanol) and purifying the solution, the quantum rod was synthesized.

Synthesis 5

Zinc nitrate (128 mg), zinc sulfate (150 mg), sulfur powder (44 mg), ZnSe core (10 mg) were dissolved in toluene (1 ml). Next, the solution was dried under the temperature of about 120° C. and for about 1 hour and was stirred under a $N_2$ condition and the temperature of about 120° C. and for about 3 hours. Next, the mixture was put into a hydrothermal reactor, where oleylamine (17 ml) was stored and was reacted under the temperature of about 250° C. and for about 24 hours. Next, by precipitating (using hexane and methanol) and purifying the solution, the quantum rod was synthesized.

In comparison to the above synthesis 1, zinc nitrate is used with zinc sulfate, sulfur powder and ZnSe core in the synthesis 2 to synthesis 5. The reaction between sulfur powder and the core is induced by zinc sulfate, and the length growth of the shell is induced by zinc nitrate.

Namely, in the quantum rod synthesized by the synthesis 1, a surface reaction between the core and sulfur powder is generated by zinc sulfate such that the ZnS shell is formed, while the length extension of the shell is not generated because there is no zinc nitrate. However, since zinc nitrate as well as zinc sulfate is anticipate the reaction for forming the shell, the length extension of the shell is activated such that the AR of the quantum rod is increased.

Figure 6A:
FIGS. 6A-6D are TEM images of quantum rods according to a second embodiment of the present invention.

In more detail, as shown in FIG. 6A, which is a TEM image of the quantum rod synthesized by the synthesis 2, the quantum rod has the AR of 1.5 to 2. The AR of the quantum rod synthesized by the synthesis 2 is larger than that of the quantum rod synthesized by the synthesis 1. However, the AR of the quantum rod is insufficient to provide light having desired linear-polarization property and be driven by the electric field. It is because the amount of zinc nitrate is relatively smaller than the amount of zinc sulfate.

Figure 6B:
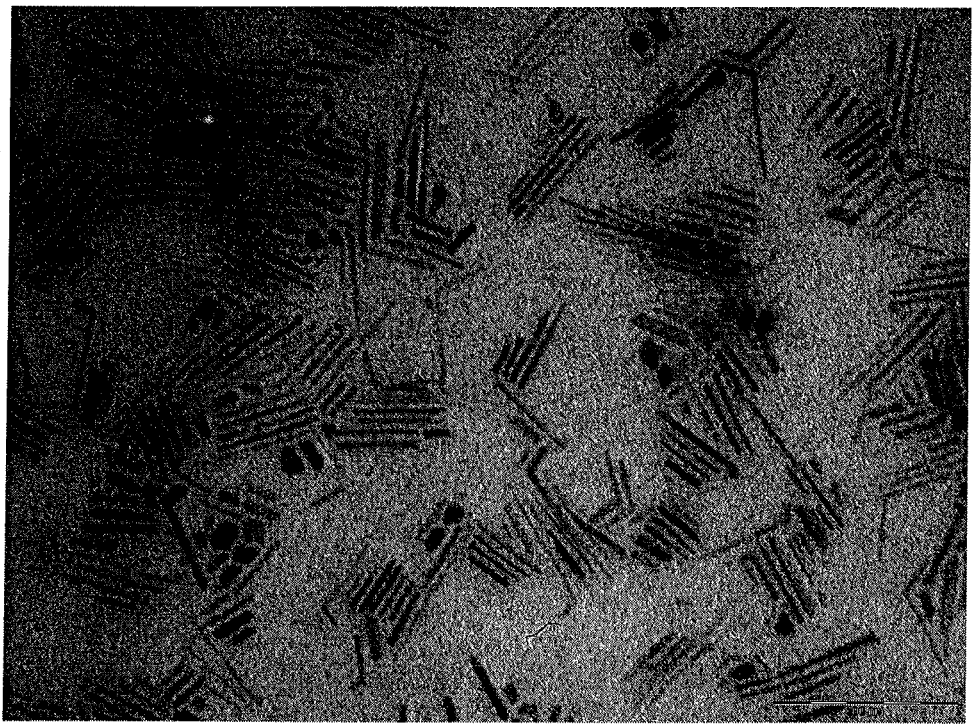

On the other hand, as shown in FIG. 6B, which is a TEM image of the quantum rod synthesized by the synthesis 3, the quantum rod has the AR above 10. However, there are quantum rods without core. Namely, the quantum rod only has the ZnS shell such that the emitting property of the quantum rod is decreased. It is because the amount of zinc nitrate is relatively larger than the amount of zinc sulfate.

Figure 6C:
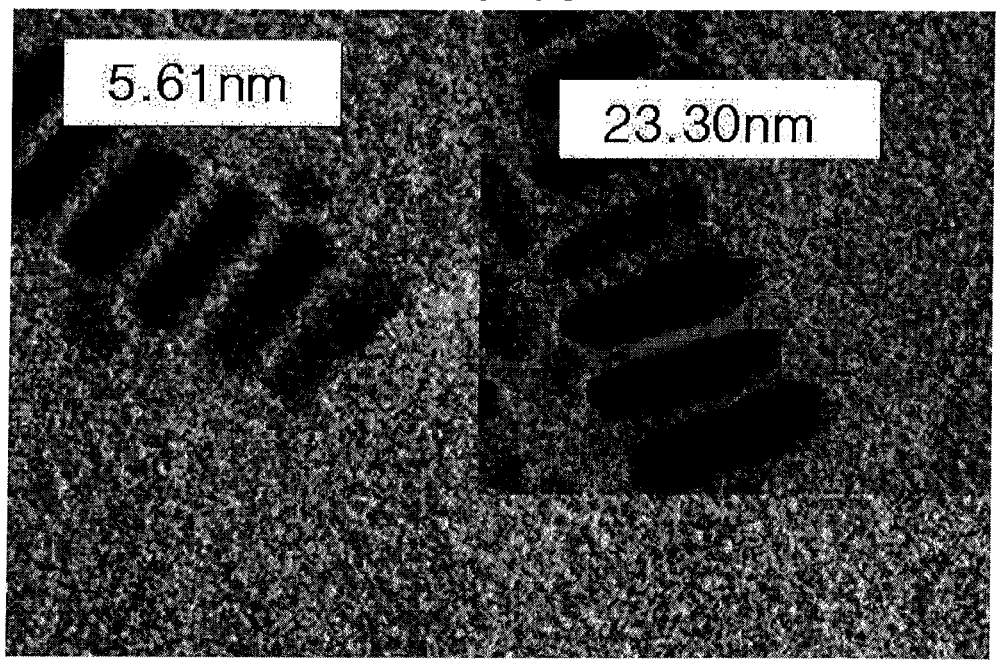
Figure 6D:
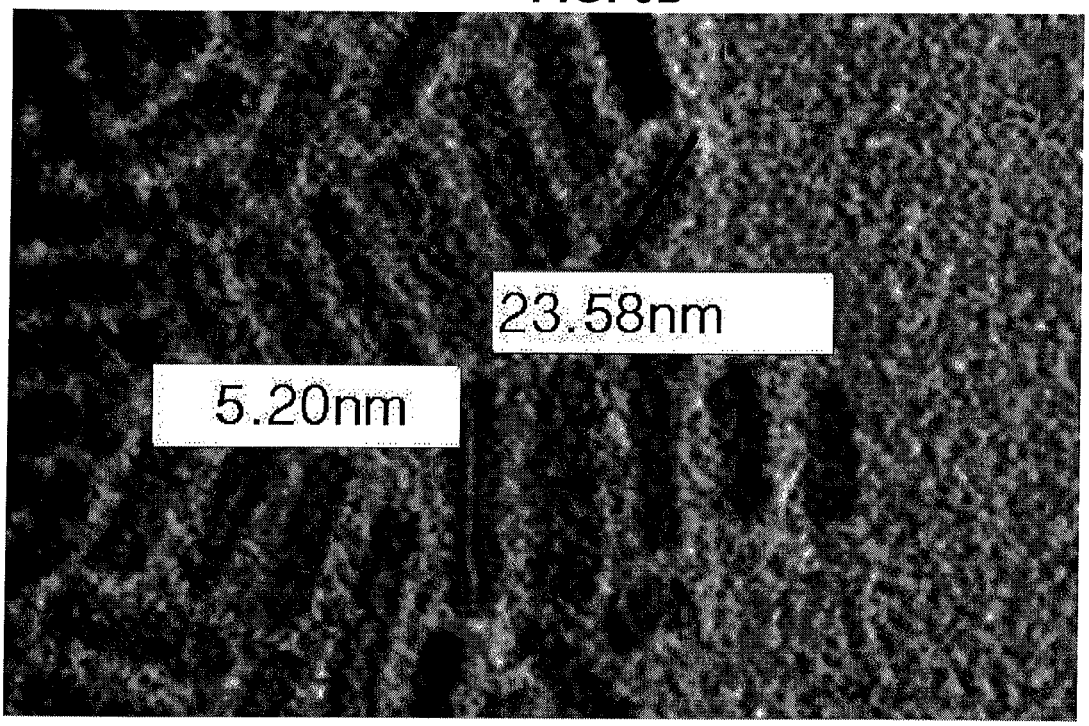

As shown in FIG. 6C, which is a TEM image of the quantum rod synthesized by the synthesis 4, the quantum rod has the AR of about 4.2. (core size=5.61 nm, shell length=23.30 nm) As shown in FIG. 6D, which is a TEM image of the quantum rod synthesized by the synthesis 5, the quantum rod has the AR of about 5. (core size=5.20 nm, shell length=25.58 nm)

In the synthesis 4 and the synthesis 5, the quantum rods are obtained with zinc sulfate and zinc nitrate of similar amount. The quantum rods include the ZnS shell as well as the core and have the AR of about 4 to 5. Since the AR of the quantum rod is decreased with relatively smaller amount zinc nitrate and the quantum rod has only the shell with relatively larger amount zinc nitrate, a weight ratio of zinc nitrate to zinc sulfate may be 1:1~1.5.

On the other hand, the quantum rods synthesized under different temperature conditions of the hydrothermal reactor have different AR. The quantum rod of the synthesis 4 (AR=4.2, the temperature=230° C.) has larger AR than the quantum rod of the synthesis 5 (AR=5, the temperature=250° C.). Namely, the AR of the quantum rod is proportional to the reaction temperature.

The reaction temperature should be higher than the boiling point of the solvent, i.e., aliphatic amine, in the hydrothermal reactor. The reaction temperature may be higher than 200, and an upper limit of the reaction temperature depends on the hydrothermal reactor. For example, the reaction temperature may be about 200 to 500° C.

In the present invention, the quantum rod includes the single-layered or multi-layered core of ZnSe and/or ZnSeS and the shell of ZnS and emits the short wavelength light.

In addition, zinc sulfate and zinc nitrate are anticipated in the reaction with the core such that the length of the shell is increased and the quantum rod has increase aspect ratio (AR). As a result, the linear-polarization property of the light from the quantum rod and the driving property of the quantum rod are increased.

After zinc nitrate, zinc sulfate, sulfur powder and the core are dissolved in the organic solvent, the solution is reacted with aliphatic amine in the reactor to obtain the quantum rod. In this instance, by controlling a ratio of zinc nitrate and zinc sulfate, the AR of the quantum rod can be controlled. In addition, by controlling the temperature of the reactor, the AR of the quantum rod can be controlled.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. A method of fabricating a quantum rod, comprising:
    dissolving zinc nitrate of a first weight, zinc sulfate of a second weight, a sulfur powder and a core including zinc compound in an organic solvent to form a mixture; and
    reacting the mixture with aliphatic amine in an reactor;
    wherein a ratio of the first weight to the second weight has a range of about 1:1~1.5.

2. The method according to claim 1, wherein the zinc compound comprises at least one of ZnSe or ZnSeS.

3. The method according to claim 2, wherein the core has a single-layered structure of one of ZnSe or ZnSeS or a multi-layered structure of one of ZnSe and ZnSeS.

4. The method according to claim 1, wherein a temperature of the reactor is higher than a boiling temperature of the aliphatic amine.

5. The method according to claim 4, wherein the aliphatic amine has 18 or fewer carbon atoms.

6. The method according to claim 4, wherein the temperature is about 200 to 500° C.

7. The method according to claim 4, wherein the aliphatic amine is one of oleylamine or oleic acid.

8. The method according to claim 1, further comprising:
    drying the mixture before the step of reacting the mixture with aliphatic amine; and
    stirring the mixture after the step of drying the mixture.

9. The method according to claim 1, wherein the core is covered with a shell including ZnS, and a ratio of a length of the shell to a size of the core has a range of about 2 to 10.

10. The method according to claim 1, wherein the core is covered with a shell including ZnS, a ratio of a length of the shell to a size of the core is controlled by a ratio of the first weight to the second weight.

11. The method according to claim 1, wherein the core is covered with a shell including ZnS, a ratio of a length of the shell to a size of the core is proportional to a temperature of the step of reacting the mixture with the aliphatic amine in the reactor.

12. The method according to claim 1, wherein a light having a wavelength of about 400 to 520 nm is emitted from the quantum rod.

13. The method according to claim 7, wherein the core is covered with a shell including ZnS, a ratio of a length of the shell to a size of the core is proportional to a temperature of the step of reacting the mixture with the aliphatic amine in the reactor.

14. A method of fabricating a quantum rod, comprising:
    dissolving zinc nitrate of a first weight, zinc sulfate of a second weight, a sulfur powder and a core including zinc compound in an organic solvent to form a mixture;
    drying the mixture;
    stirring the mixture; and
    reacting the mixture with aliphatic amine in an reactor.

15. The method according to claim 14, wherein the zinc compound comprises at least one of ZnSe or ZnSeS.

16. The method according to claim 15, wherein the core has a single-layered structure of one of ZnSe or ZnSeS or a multi-layered structure of one of ZnSe and ZnSeS.

17. The method according to claim 16, wherein a ratio of the first weight to the second weight has a range of about 1:1~1.5.

18. The method according to claim 14, wherein a temperature of the reactor is higher than a boiling temperature of the aliphatic amine.

19. The method according to claim 18, wherein the aliphatic amine has 18 or fewer carbon atoms.

20. The method according to claim 18, wherein the temperature is about 200 to 500° C.

21. The method according to claim 18, wherein the aliphatic amine is one of oleylamine or oleic acid.

22. The method according to claim 18, wherein the core is covered with a shell including ZnS, and a ratio of a length of the shell to a size of the core has a range of about 2 to 10.

23. The method according to claim 14, wherein the core is covered with a shell including ZnS, a ratio of a length of the shell to a size of the core is controlled by a ratio of the first weight to the second weight.

24. The method according to claim 14, wherein a light having a wavelength of about 400 to 520 nm is emitted from the quantum rod.

* * * * *